US011621109B2

(12) United States Patent
Flores

(10) Patent No.: US 11,621,109 B2
(45) Date of Patent: Apr. 4, 2023

(54) MAGNETIC PLUGS FOR ELECTRICAL CONTAINMENT ENCLOSURES

(71) Applicant: Victor Manuel Flores, Santa Cruz, CA (US)

(72) Inventor: Victor Manuel Flores, Santa Cruz, CA (US)

(*) Notice: Subject to any disclaimer, the term of this patent is extended or adjusted under 35 U.S.C. 154(b) by 72 days.

(21) Appl. No.: 17/368,690

(22) Filed: Jul. 6, 2021

(65) Prior Publication Data

US 2022/0384075 A1  Dec. 1, 2022

Related U.S. Application Data

(60) Provisional application No. 63/192,992, filed on May 25, 2021.

(51) Int. Cl.
*H01F 7/02* (2006.01)
*H05K 5/02* (2006.01)

(52) U.S. Cl.
CPC ............ *H01F 7/02* (2013.01); *H05K 5/0217* (2013.01)

(58) Field of Classification Search
CPC ............... H01H 71/345; H01H 1/0206; H01H 2001/0205
See application file for complete search history.

(56) References Cited

U.S. PATENT DOCUMENTS

| | | | | |
|---|---|---|---|---|
| 3,358,870 A | * | 12/1967 | Larkins | F16B 5/0664 220/309.2 |
| 4,051,322 A | * | 9/1977 | Park | H02G 3/0691 174/664 |
| 4,075,749 A | * | 2/1978 | Hubeny | B25B 7/02 29/268 |
| 5,147,979 A | * | 9/1992 | Yang | H02G 3/185 174/482 |
| 6,940,012 B2 | * | 9/2005 | Case | H02G 3/088 439/535 |
| 9,248,454 B2 | * | 2/2016 | Colladon | B03C 1/286 |
| 2010/0018071 A1 | * | 1/2010 | McKinley | D06F 58/22 34/82 |
| 2015/0236487 A1 | | 8/2015 | Myers et al. | |
| 2019/0067922 A1 | | 2/2019 | Platt | |
| 2020/0278067 A1 | | 9/2020 | Symington et al. | |
| 2021/0122011 A1 | | 4/2021 | Kitaura et al. | |
| 2021/0134481 A1 | | 5/2021 | Vogel | |

* cited by examiner

*Primary Examiner* — Bernard Rojas
(74) *Attorney, Agent, or Firm* — Donald R. Boys; Central Coast Patent Agency LLC

(57) ABSTRACT

A magnetic plug and method of plugging unwanted knockout holes in electrical containment enclosures. The method requires only one hand and is performed without tools. Everything can be done from outside the electrical containment enclosure. The actual plugging step is completed in a few seconds. One of nine invented plugs is selected to best match the nine standardized hole diameters found in electrical containment enclosures. Selecting the correct plug size results in the best fit and feel since perception matters. Savings in time and money is expected to pay back the cost of a plug.

19 Claims, 6 Drawing Sheets

MAGNETIC PLUGS FOR ELECTRICAL CONTAINMENT ENCLOSURES

CROSS-REFERENCE TO RELATED APPLICATIONS

This application claims benefit to U.S. provisional application 63/192,992 dated May 25, 2021 filed by Victor Flores. Confirmation number 7557. Provisional application 63/192,992 is hereby incorporated by reference in its entirety.

STATEMENT REGARDING FEDERALLY SPONSORED RESEARCH

Not Applicable

REFERENCE TO A MICROFICHE APPENDIX

Not Applicable

BACKGROUND OF THE INVENTION

Field of the Invention

This invention relates to plugging holes in electrical containment enclosures. When containment enclosures are reused, open knockout holes must be sealed if they are not in a useful position. Particularly, an invented magnetic plug leads to an effective and simple method of plugging. The plugging method requires no tools and may be performed with one hand.

Description of Related Art

Knockout holes in electrical enclosures are opened to accommodate the direction of incoming cables and wires. Later, the enclosure installation may not be needed, and the enclosure is removed from service. Normally, the enclosure is saved for a future use.

The following enclosure installation will likely open new knockout holes and seal those holes that are not needed. Current sealing techniques work, but they are awkward and time-consuming. Sometimes they are unreliable. Tools are required.

One current technique uses an outside plate, an internal bracket, and a connecting screw. This requires two hands and a screwdriver. One hand must be inside the enclosure. This sealing method requires significant time and wastes money.

A second current technique uses a circular plug possessing a perimeter of spring-loaded protrusions. An electrician holds the plug with one hand and hammers it into the open hole with the other hand. Sometimes the protrusions become bent past their elastic limit and are no longer functional. Further, hitting fingers with the hammer is a common occurrence.

The same two techniques have been used for years. There is a long-understood need for a better method, but it has been unserved before this current invention.

Goals for a better method include:
(a) can be performed from the outside of the electrical enclosure,
(b) requires no tools,
(c) requires only one hand,
(d) self-inserting (The plug pulls itself into the hole to close it.), and
(e) easily removable.

BRIEF SUMMARY OF THE INVENTION

The present invention is a method of using a magnetic plug to close knockout holes in electrical containment enclosures. Electric containment enclosures include electrical boxes, switching cabinets, and centralized control panels. Any enclosure where knockout holes are used for cables or wires is defined as an electrical containment enclosure within this disclosure.

Electrical containment enclosures contain iron for grounding and safety reasons, and magnets adhere.

When new electrical containment enclosures are purchased, knockout holes are sealed. An electrician opens the knockout holes to permit cables and wires to pass. Later when the enclosure is reconfigured for another use, open holes may be sealed while new holes are opened.

Sealing open holes has historically been awkward and time consuming. Tools are required and two hands are needed.

The invented method uses magnetic plugs to seal holes. Holes are sealed in seconds, which saves time and money. Electrical contractors can offer better quotes and close more business.

In short, the magnetic fitting is simply centered over an open hole. Physics does the rest. The magnetic plug is drawn into the hole, and the job is done. An undisturbed plug will stay in place unless the electrician purposely removes it. This is a one-handed job without tools.

Magnetic plugs are specific to the method due to standardized hole sizes and desirable fitting parameters. The inventor believes that these specifically sized plugs are not useful for other applications.

Knockout holes have specific diameters: 0.5 inch, 0.75 inch, 1.0 inch, 1.5 inch, 2.0 inch, 2.5 inch, 3.0 inch, 3.5 inch, and 4.0 inch. Diameters are precise within 0.01 inches. No intermediate diameters are used.

Fitting parameters address the issue, "how large is the gap between the knockout hole and the magnetic plug section that fills the hole?". This gap affects production cost. As the gap increases, magnet size must increase to assure that the hole is completely covered. And the magnet is the most expensive component. A snug fit saves cost. A gap of 0.1 inch is reasonable.

An invented magnetic plug works with structures that adhere to a magnet. For example, holes in plastic, copper or aluminum cannot use a magnetic plug.

DETAILED DESCRIPTION OF THE INVENTION

Figure 1:
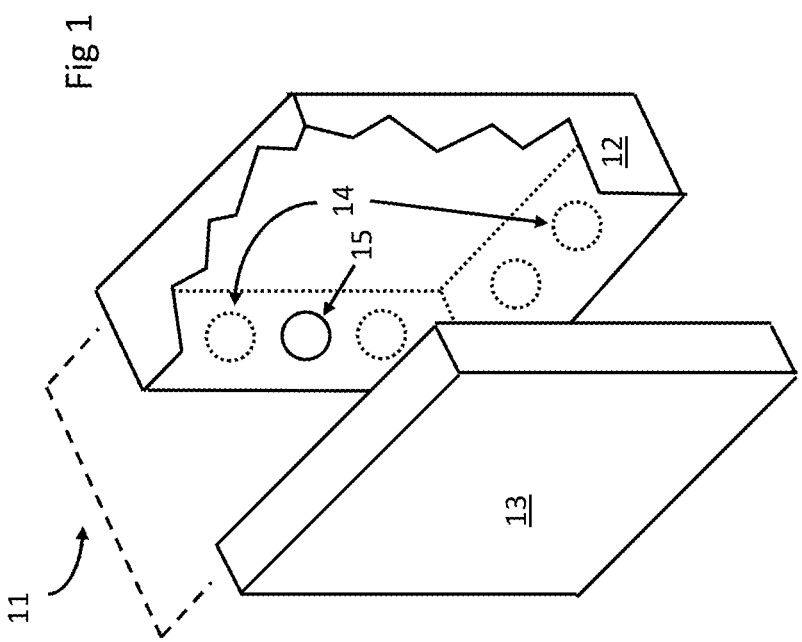
FIG. 1 shows a standard electrical box with one open knockout hole and four closed knockout holes. A standard electrical box is an example within the category of electrical containment enclosures. The front cover has been separated from the back side.

Refer to FIG. 1. A standard electrical box 11 is diagrammed with the back side 12 and the front cover 13 separated for viewing. In the back side, there are four closed knockout holes 14 and one open knockout hole 15 shown.

The open knockout hole 15 may have been recently opened to accommodate a wiring cable. Alternately, open knockout hole 15 may have been opened on a previous installation. If so, it may be in an incorrect position for a current installation project and require plugging.

Figure 2:
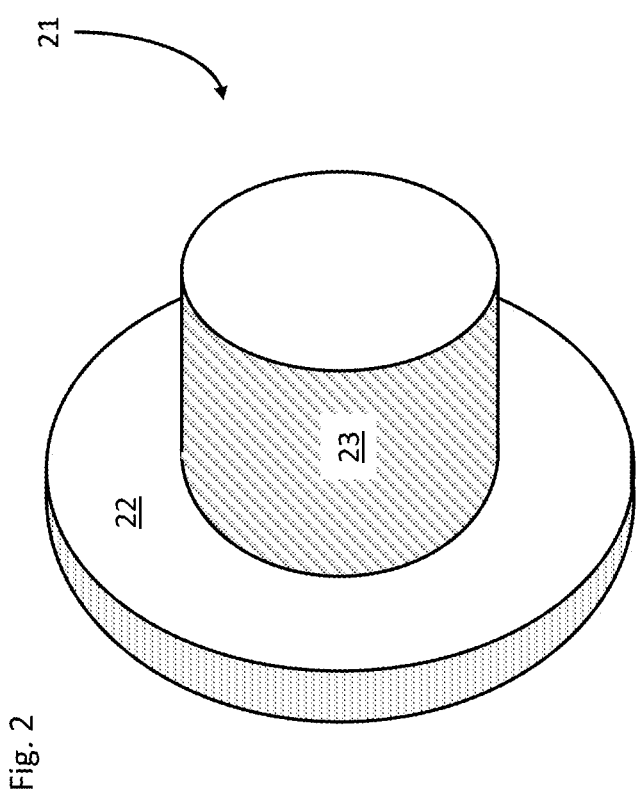
FIG. 2 is a diagram of a magnetic plug. A magnet is on the left. A post is on the right.
Figure 3A:
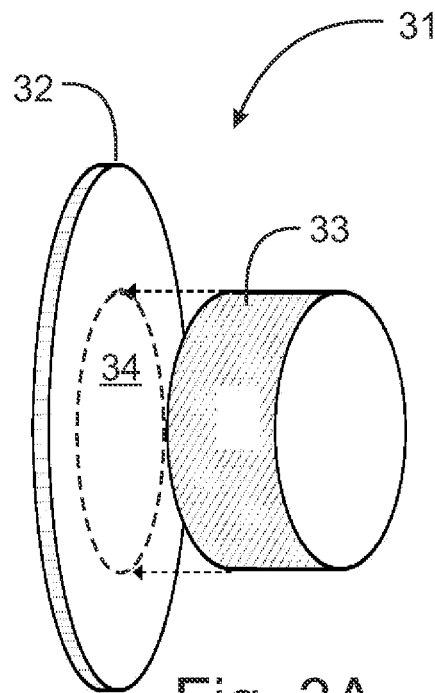
FIG. 3A shows the post as a cylinder.
Figure 3B:
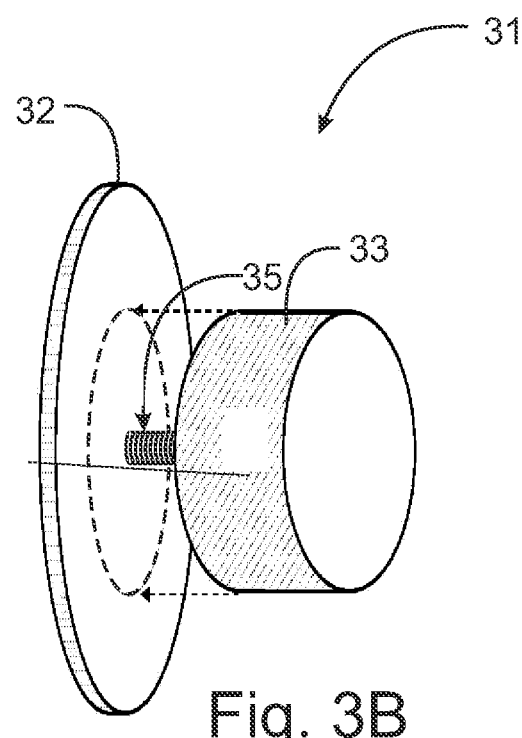
FIG. 3B shows a screw connecting the magnet and the post.
Figure 3C:
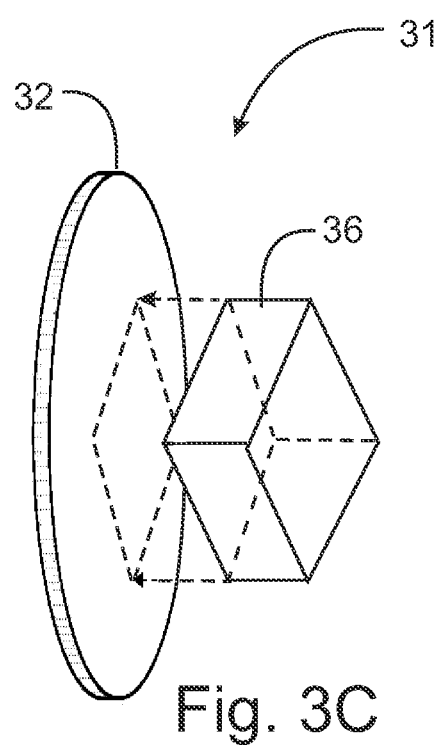
FIG. 3c shows the post as a three-dimensional polygon.
Figure 3D:
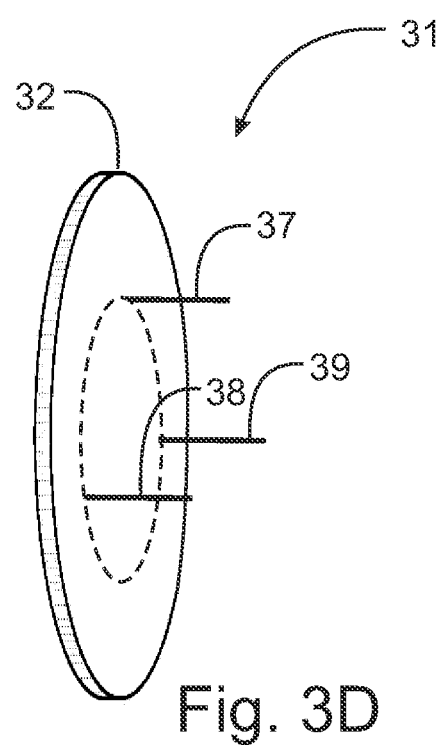
FIG. 3D shows the post as three pins.

Refer to FIG. 2. The invented magnetic plug 21 has two sections. The first is a magnet 22, and the second is the pass-through post 23.

The magnet 22 holds the magnetic plug to the outside enclosure surface. The post 23 passes through an open knockout hole to prevent escape by sideways movement. The magnet 22 is larger than the knockout hole diameter and completely covers the hole, regardless of post 23 centering within the hole.

In a preferred embodiment, the magnet 22 is flat and conforms to the flat surface of an electrical containment enclosure. As shown in FIG. 2, the magnet is circular, but other shapes (such as polygons) will work.

Similarly, the post 23 is shown as cylindrical, but other shapes will work. For example, a 3-dimensional triangle—whose three apex points fit within a circle—can replace the corresponding cylinder. The ability to prevent sideways motion would not be diminished. Three pins extending from the magnet 22 would also serve as the post 23 if the three pins form a circle.

A post does not have to be magnetic. For example, polymers, copper, or aluminum may be used. Insulative polymer posts eliminate a shorting possibility.

Refer to FIG. 3. The prototype magnetic plug 31 uses adhesive 34 to hold magnet 32 to the post 33. In the prototype, a United States silver coin was used as the post 33. As drawn in FIG. 3, the post appears thicker than a coin. However, the diagram is not drawn to scale, and the coin worked well for the prototype. FIG. 3A shows post 33 as a cylinder. FIG. 3B shows a screw 35 connecting magnet 32 and post 33. FIG. 3C shows post 33 as a three-dimensional polygon. FIG. 3D shows the post as three pins 37, 38 and 39.

To make the magnetic plug 31, multiple methods of attaching the magnet 32 to the post 33 are available. For example, screws and threading may be used. One of ordinary skill can select alternate attachment methods from a finite list of choices.

Figure 4:
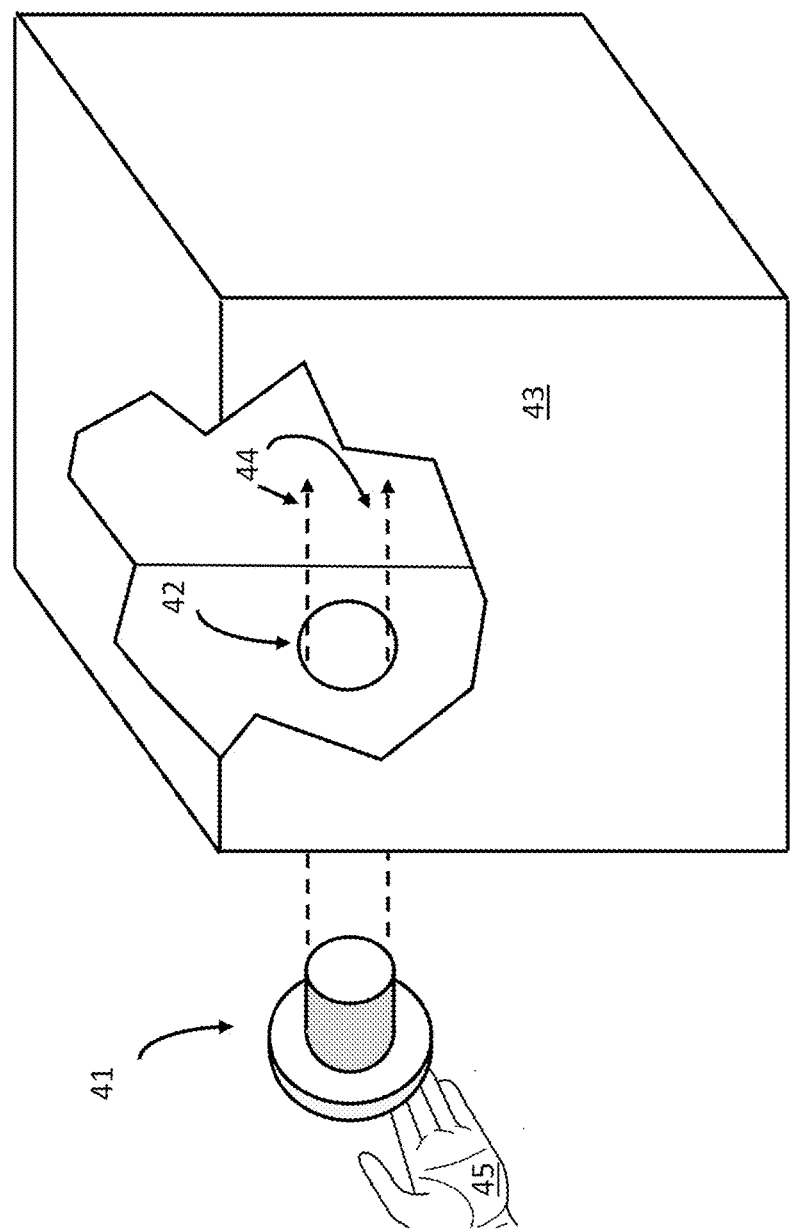
FIG. 4 shows a magnetic plug and the plug's fit to a general electrical containment enclosure. The view is prior to insertion.

Refer to FIG. 4. A magnetic plug 41 penetrates an open knockout hole 42 in an electrical containment enclosure 43. The dashed arrows 44 indicate the direction of pull due to magnetic attraction. When the magnetic plug 41 approaches the open knockout hole 42 from the outside of the electrical containment enclosure 43, it is pulled inward. No tools or manual force is needed. As the magnetic plug 41 gets closer to the electrical containment enclosure 43, the attractive force gets stronger.

The hand 45 is added to indicate that the method of use requires only one hand. One hand holds the magnetic plug 41, moves it close to the open knockout hole 42, centers it, and releases it when the magnetic pull is sufficient. The method is done from outside the electrical containment enclosure 43. This can be performed without opening a door or removing a cover.

Figure 5:
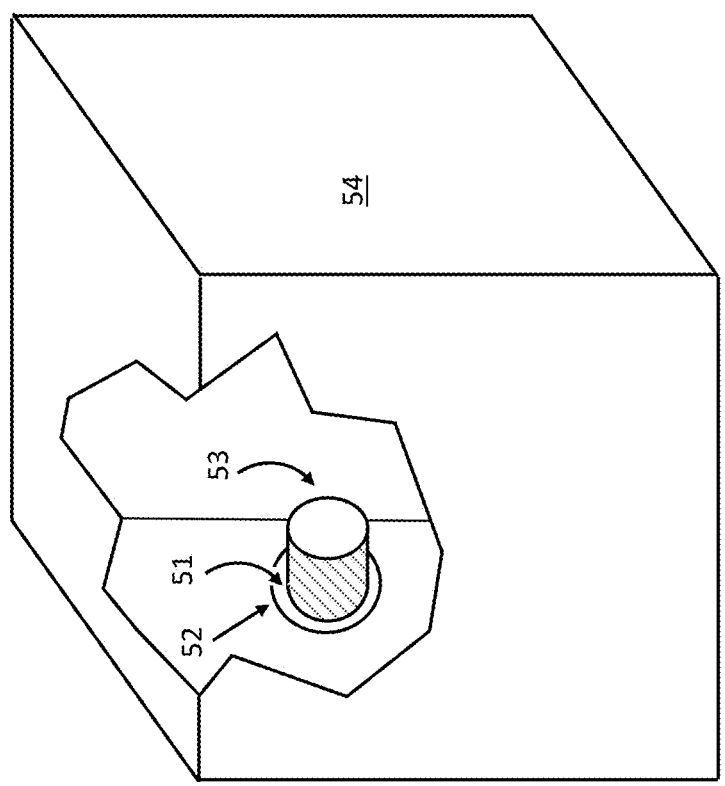
FIG. 5 shows a magnetic plug after insertion into an electrical containment enclosure. The plug is viewed from inside the electrical containment enclosure.

Refer to FIG. 5. This figure shows a plugged knockout hole 52 from inside the electrical containment enclosure 54. The post 53 is fully positioned within the closed knockout hole 52. A gap 51 between the closed knockout hole 52 and the post 53 exists and deserves comment. The magnet (not numbered) is visible through the gap 51.

In a preferred embodiment, the gap 51 should evoke a smooth yet snug sealing. Perception is important for invention commercialization. If the gap 51 is too small, edge imperfections in the knockout hole 52 could interfere with the smooth entry of the post 53. If the gap 51 is too large, centering of the post 53 within the knockout hole 52 becomes inexact, and the post 53 could be displaced from the center.

If a small diameter post 53 were to contact an edge of the knockout hole 52, a larger magnet would be needed to assure full coverage of the knockout hole 52. Since the magnet is the more expensive component of a magnetic plug, production cost increases.

An undersized or oversized post 53 remains within the scope of this current invention. However, a gap 51 of 0.10 inch (or less) is used in a preferred embodiment.

Figure 6:
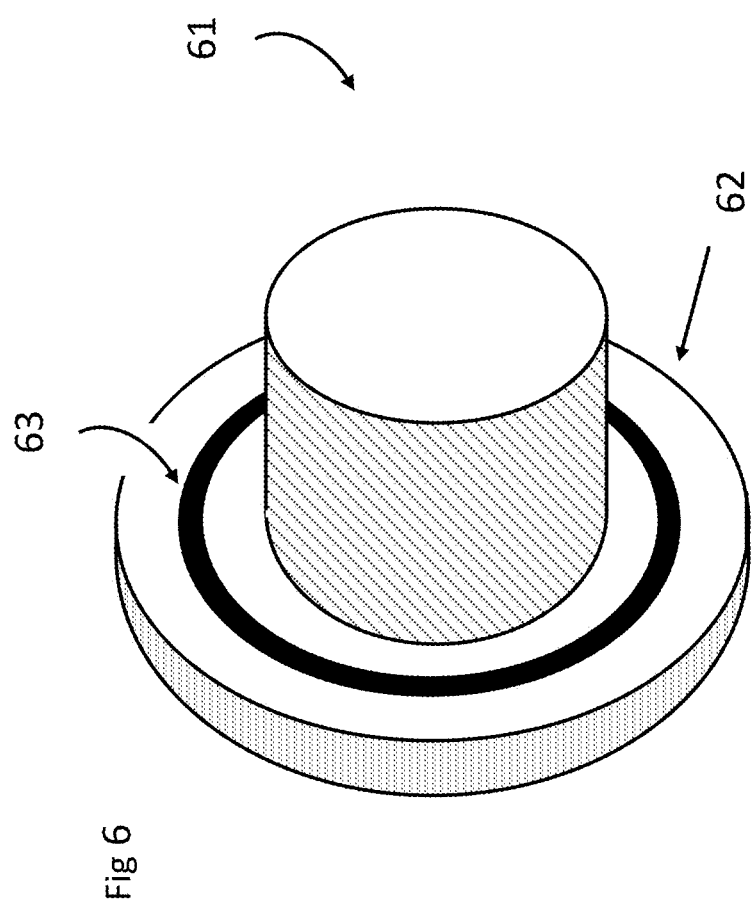
FIG. 6 shows a magnetic plug that has been modified with a gasket on the magnet to prevent dirt, liquid and vapor intrusion.

Refer to FIG. 6. For some installations, it is necessary to prevent liquids or organic vapors from penetrating a plugged knockout hole. To meet this requirement, a gasket 63 is placed between the magnet 62 and surface of an electrical containment enclosure. Commercially, the gasket may be included as a component of the magnetic plug 61.

The method of using a magnetic plug for electrical containment enclosures comprises:
  selecting one of nine magnetic plugs to match the size of an open knockout hole, starting the plugging process from outside the electrical containment enclosure without tools,
  bringing the magnetic plug close to the open knockout hole until the magnetic attraction is felt,
  centering the post over the knockout hole, and
  releasing the magnetic plug. Magnetic attraction does the plugging work.

The invented plugging method only requires one hand. Two hands may be used at the discretion of the electrician and remain within the invented method.

I claim:

1. A method of plugging knockout holes in an electrical containment enclosure with one or more magnetic plugs wherein,
  the enclosure has too many open knockout holes or has open knockout holes at non-functional positions,
  comprising:
  choosing a magnetic plug that includes a magnet attached to a post;
  selecting the magnetic plug so that the post fits through the knockout hole and the magnet side is too large to fit through the knockout hole wherein,
  the knockout hole diameter is selected from a group consisting of 0.5 inch, 0.75 inch, 1.0 inch, 1.5 inch, 2.0 inch, 2.5 inch, 3.0 inch, 3.5 inch and 4.0 inch;
  centering the magnetic plug over the open knockout hole with the post oriented toward the knockout hole and the magnet oriented away from the knockout hole; and releasing the magnetic plug so that the post enters the knockout hole and the magnet side holds the magnetic plug in place.

2. The method of claim 1 wherein the centering and releasing steps are performed with one hand and no tools.

3. The method of claim 1 further adding a compressible gasket to prevent entry of dirt, liquid or vapor.

4. The method of claim 1 wherein the magnet completely covers the knockout hole, regardless of post positioning within the knockout hole.

5. The method of claim 1 wherein the magnet is flat.

6. The method of claim 1 wherein the magnet or post is shaped as a cylinder, or as a 3-dimensional polygon.

7. The method of claim 1 wherein the post comprises 3 pins.

8. The method of claim 1 wherein the method is performed without opening an enclosure door or removing an enclosure cover.

9. The method of claim 1 wherein an open gap between the knockout hole perimeter and the post is less or equal to 0.10 inch.

10. A magnetic plug for plugging a knockout hole in an electrical containment enclosure comprising:
 a magnet that holds the magnetic plug to the enclosure,
 a post that passes through the knockout hole, and
 a rigid attachment between the magnet and the post.

11. The magnetic plug of claim 10 wherein the post is specifically sized for a knockout hole whose diameter is selected from a group consisting of 0.5 inch, 0.75 inch, 1.0 inch, 1.5 inch, 2.0 inch, 2.5 inch, 3.0 inch, 3.5 inch and 4.0 inch.

12. The magnetic plug of claim 10 wherein the post is a magnet or is made from a material that is attracted to a magnetic field.

13. The magnetic plug of claim 10 wherein the post is not a magnet or is not made from a material that is attracted to a magnetic field.

14. The magnetic plug of claim 10 wherein adhesive connects the magnet to the post.

15. The magnetic plug of claim 10 wherein a screw connects the magnet to the post.

16. The magnetic plug of claim 10 wherein the magnet or post is shaped as a cylinder, or as a 3-dimensional polygon.

17. The magnetic plug of claim 10 wherein the post comprises 3 pins that define a circle by being equidistant from a central location.

18. The magnetic plug of claim 10 wherein the magnet completely covers the knockout hole regardless of post location within the knockout hole.

19. The magnetic plug of claim 10 wherein the post comprises an insulative polymer.

\* \* \* \* \*